(12) United States Patent
Yamamoto et al.

(10) Patent No.: US 6,422,452 B2
(45) Date of Patent: Jul. 23, 2002

(54) METHOD AND APPARATUS FOR LINING UP MICRO-BALLS

(75) Inventors: Takumi Yamamoto; Kazuhiko Futakami; Akira Hatase, all of Hamamatsu; Nobuaki Takahashi, Tokyo; Naoji Senba, Tokyo; Yuzo Shimada, Tokyo, all of (JP)

(73) Assignee: Japan E M Co., Ltd., Tokyo (JP)

( * ) Notice: Subject to any disclaimer, the term of this patent is extended or adjusted under 35 U.S.C. 154(b) by 0 days.

(21) Appl. No.: 09/768,837

(22) Filed: Jan. 25, 2001

(30) Foreign Application Priority Data

Jan. 25, 2000  (JP) ........................................ 2000-015939

(51) Int. Cl.[7] .......................... B23K 1/00; B23K 20/14; B23K 31/02
(52) U.S. Cl. .......................... 228/246; 228/6.2; 228/41; 228/262
(58) Field of Search ................................ 228/246, 245, 228/256, 262, 6.1, 6.2, 41

(56) References Cited

U.S. PATENT DOCUMENTS

| 4,531,986 A | * | 7/1985 | Barajas .......................... 148/24 |
| 4,871,110 A | * | 10/1989 | Fukasawa et al. .......... 228/245 |
| 5,626,277 A | * | 5/1997 | Kawada ....................... 228/246 |
| 5,839,641 A | * | 11/1998 | Teng ............................ 118/213 |
| 5,976,965 A |   | 11/1999 | Takahashi et al. |
| 6,095,398 A | * | 8/2000 | Takahashi et al. ..... 228/180.22 |

FOREIGN PATENT DOCUMENTS

JP           5-129374           5/1993

* cited by examiner

Primary Examiner—Tom Dunn
Assistant Examiner—Zidia Pittman
(74) Attorney, Agent, or Firm—Workman, Nydegger & Seeley

(57) ABSTRACT

An apparatus for lining up micro-balls in accordance with the present invention includes: ball carrying pallets having a plurality of pits for holding the micro-balls, respectively, on its surface, a pallet holder for holding the ball carrying pallets, a lining-up container defining a sealed chamber in association with the pallet holder hermetically fitted thereto, a storing tank for storing liquid carrier in which micro-balls are dispersed, and applying/collecting device for communicating the storing tank with the lining-up container via a passage to supply the micro-balls together with the liquid carrier from the storing tank to the sealed chamber and return the surplus micro-balls together with the liquid carrier from the sealed chamber to the storing tank.

11 Claims, 12 Drawing Sheets

METHOD AND APPARATUS FOR LINING UP MICRO-BALLS

This application is based on Japanese Patent Application No. 2000-15939 filed Jan. 25, 2000, the content of which is incorporated hereinto by reference.

BACKGROUND OF THE INVENTION

1. Field of the Invention

The present invention relates to a method and an apparatus for holding micro-balls in a plurality of pits, respectively, opened on the surface of a ball carrying pallet. Particularly, the present invention is suitably applied to solder balls for forming electrode bumps on a circuit board or the like.

2. Description of the Related Art

When solder balls are placed on a bump-forming portion in a semiconductor chip or a circuit board coated in advance with flux, and molten to form electrode bumps, it is necessary to accurately position the solder balls of a micro size must be to the bump-forming portion in the semiconductor chip or the circuit board. For this purpose, a template or a ball carrying pallet is used, having a plurality of pits arranged thereon in the same pattern as that of the electrode bumps to be formed in the objective. That is, there has been known a method in which the solder balls placed in the pits of the ball carrying pallet are attractively held at once by a suction head with vacuum, and after the suction head has been located directly above the objective such as a semiconductor chip or a circuit board so that the lower end of the respective solder ball attractively held in the suction head is brought into contact with the flux on the bump-forming portion, the solder balls are released from the suction to transfer onto the flux in the bump-forming portion. Such a method is disclosed, for example, in Japanese Patent Application Laid-open No. 5-129374 (1993).

In this case, it is necessary for the solder balls to be held neither too much nor too less in the pits of the ball carrying pallet. In general, it is not so easy to hold the solder balls on the ball carrying pallet nether too much nor too less since the solder ball is extremely small in size.

To solve this problem, Japanese Patent Application Laid-open No. 11-8272 (1999) proposes a technology wherein a ball carrying pallet formed of silicon wafer is immersed in ethanol, and solder balls are made to drop onto ball carrying pallet through the ethanol, then rolled thereon to get into the individual pits. This method is advantageous in that the ball-carrying pallet can be quickly and easily dried due to the high volatility of ethanol, whereby the delay of subsequent process is avoidable.

On the other hand, a dry method for lining up the solder balls in air is problematic in that the solder balls are stuck to each other or to the surface of the ball carrying pallet due to static electricity or moisture, resulting in the difficulty in the stable lining-up operation.

Contrarily, an aforementioned wet method disclosed in Japanese Patent Application Laid-open No. 11-8272 (1999) is advantageous because it is possible to stably line up the solder balls in the pits of the ball carrying pallet while avoiding the adverse effect due to static electricity or moisture generated in air. It requires, however, the frequent replenishment of ethanol because of the high volatility of the latter. Further, a large amount of ethanol is necessary for continuing a stable operation. Also, since the ball-carrying pallet is in general small in thickness, the handling thereof in the immersed state in ethanol is considerably difficult.

SUMMARY OF THE INVENTION

An object of the present invention is to provide a method for lining up micro-balls, capable of suppressing the consumption of highly volatile liquid carrier used in a wet method as well as of easily holding the micro-balls in pits of a ball carrying pallet, and an apparatus for carrying the method.

A first aspect of the present invention is a method for lining up micro-balls in a plurality of pits, respectively, formed on surfaces of ball carrying pallets, comprising the steps of:

defining a first sealed chamber by attaching the ball carrying pallets to a lining-up container so that the surfaces of the ball carrying pallets abut on the chamber, supplying the micro-balls dispersedly mixed with liquid carrier stored in a second sealed chamber to the first sealed chamber via a flexible duct so that the micro-balls are held in the pits of the ball carrying pallets, respectively, returning the surplus solder balls together with the liquid carrier from the first sealed chamber to the second sealed chamber via the duct, and removing the ball carrying pallets from the lining-up container.

The method for lining up micro-balls according to the first aspect of the present invention may further comprise the step for vibrating the ball carrying pallets while supplying the liquid carrier in which are dispersed the micro-balls to the first sealed chamber.

The transfer of the micro-balls and the liquid carrier between the first and second chambers may be carried out by shifting the relative positions of both the sealed chambers in the vertical direction.

The liquid carrier may be electrically conductive. In this case, the liquid carrier may be alcohol. If the liquid carrier is electrically conductive, such as alcohol, the micro-balls can be more assuredly held in the individual pits, and further the ball-carrying pallet can be quickly dried while holding the micro-balls in the pits.

The micro-balls may be solder balls.

A second aspect of the present invention is an apparatus for lining up micro-balls, comprising ball carrying pallets, each having a plurality of pits for holding the micro-balls, respectively, on its surface, a pallet holder for holding the ball carrying pallets, a lining-up container defining a sealed chamber in association with the pallet holder hermetically fitted thereto, an storing tank for storing liquid carrier in which micro-balls are dispersed, and applying/collecting means for communicating the storing tank with the lining-up container via a passage to supply the micro-balls together with the liquid carrier from the storing tank to the sealed chamber and return the surplus micro-balls together with the liquid carrier from the sealed chamber to the storing tank.

In the present invention, the pallet holder carrying the ball carrying pallets is hermetically fitted with the lining-up container to define the first sealed chamber. In this state, the micro-balls in the storing tank defining the second sealed chamber are fed by the pumping means to the first sealed chamber together with the liquid carrier so that the micro-balls get into the individual pits formed on the surface of the ball carrying pallets. Then, surplus micro-balls are returned from the first sealed chamber to the storing tank together with the liquid carrier by the pumping means, after which the pallet holder together with the ball carrying pallets carrying the solder balls in the respective pits is removed from the lining-up container defining the first sealed chamber now having no liquid carrier therein.

According to the present invention, it is possible to suppress the consumption of highly volatile liquid carrier and stably carry out the operation for lining up the solder balls in the pits of the ball carrying pallets because an amount of liquid carrier is maintained substantially constant. Also, since the ball carrying pallets are mounted to the pallet holder which in turn is detachably mounted to the lining-up container, the handling of the ball carrying pallets is extremely enhanced, whereby the lining-up operation can be automated to facilitate the working efficiency.

An apparatus for lining up micro-balls according to the second aspect of the present invention may further comprise vibration means for vibrating the pallet holder while the latter is fitted to the lining-up container. In this case, the micro-balls can be quickly and assuredly held in the respective pits.

The applying/collecting means may transport the liquid carrier by changing a position of the storing tank in the vertical direction relative to the lining up container fitted with the pallet holder. In this case, there is no need for using a pump having a high probability of blockage due to micro-balls.

The applying/collecting means may operate to incline, relative to the horizontal plane, the surfaces of the ball carrying pallets held by the pallet holder fitted with the lining-up container. In this case, an amount of liquid carrier remaining on the surface of the pallet can be limited as small as possible to minimize the consumption thereof.

The micro-balls may be solder balls.

The above and other objects, features and advantages of the present invention will become more apparent from the following description of embodiments thereof taken in conjunction with the accompanying drawings.

DETAILED DESCRIPTION OF THE PREFERRED EMBODIMENTS

The present invention will be described in more detail below with reference to one embodiment of an apparatus for lining up micro-balls illustrated in FIGS. 1 to 14, applied to solder balls for forming electrode bumps. The present invention, however, should not be limited to this embodiment but may be applied to other technologies to be included in the concept defined within a scope of claims appended to this specification.

Figure 1:
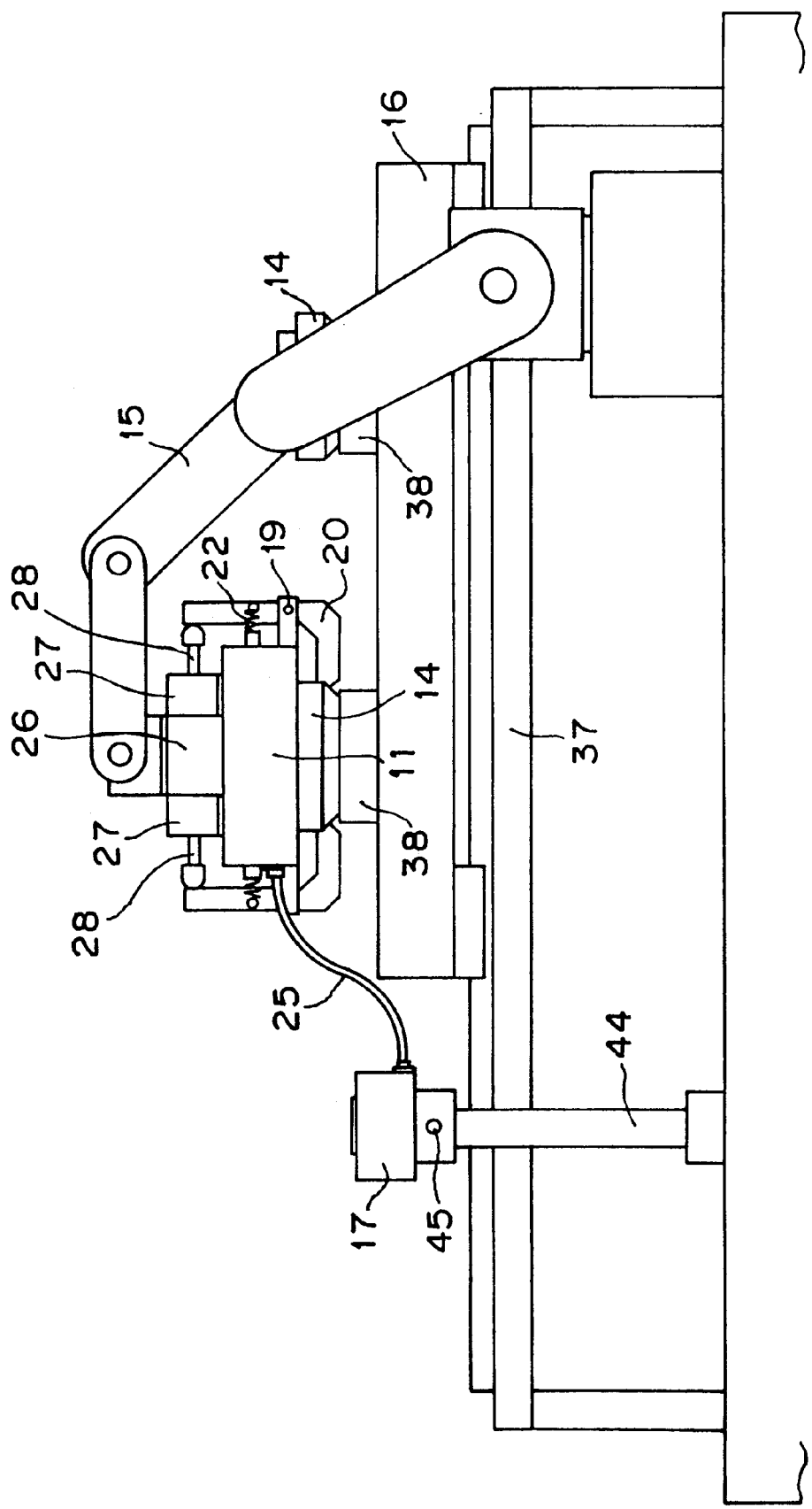
FIG. 1 is a front view illustrating a schematic construction of one embodiment of an apparatus for lining up micro-balls according to the present invention.
Figure 2:
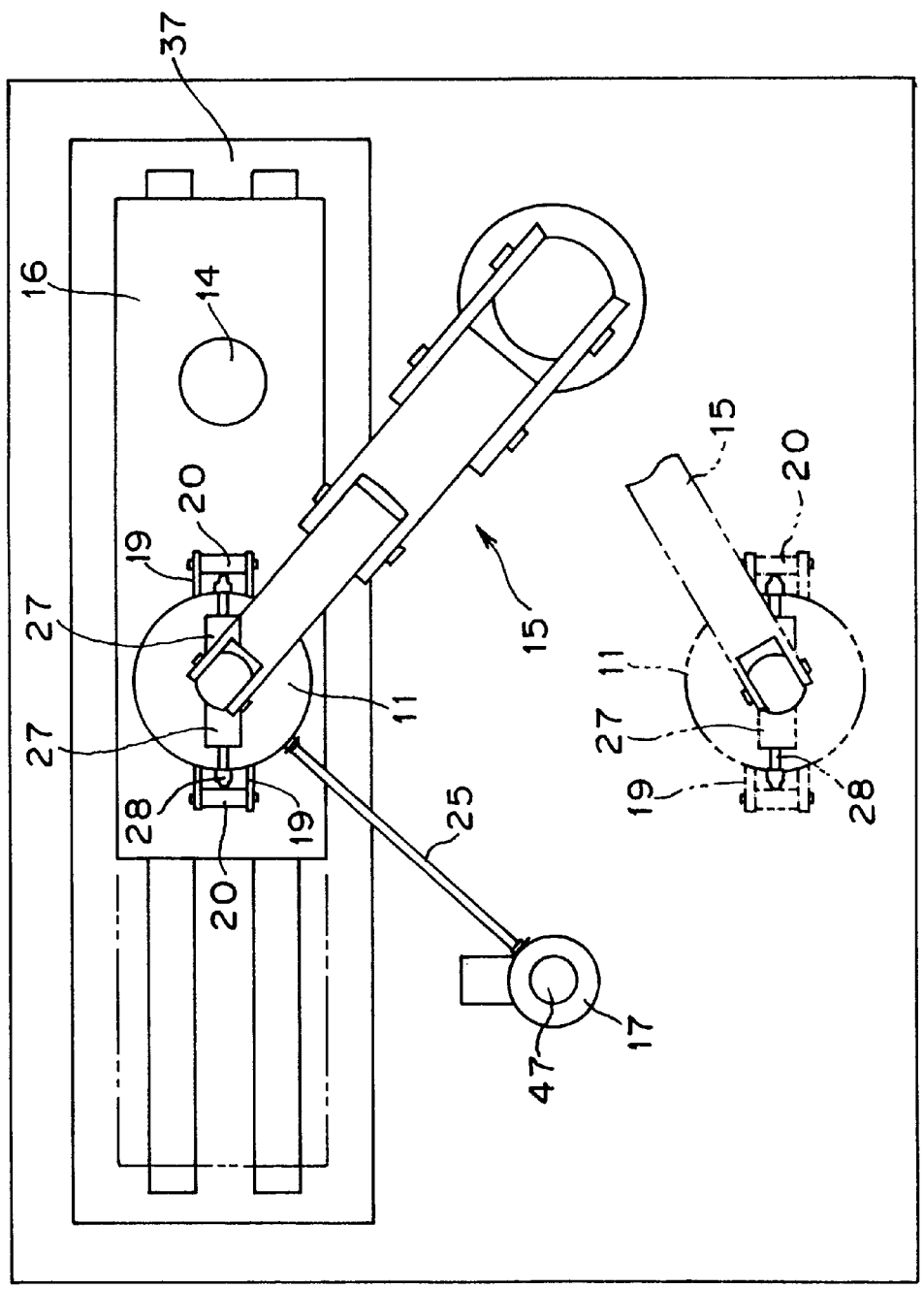
FIG. 2 is a plan view of the embodiment shown in FIG. 1.

FIG. 1 illustrates a schematic construction of an apparatus for lining up solder balls, and FIG. 2 illustrates a plan view thereof. The apparatus for lining up the solder balls according to the present invention includes a lining-up container 11, a pallet holder 14 detachably fitted to an opening 12 provided in the bottom of the lining-up container 11 to define a sealed chamber 13 within the interior of the lining up container 11, a manipulator 15 for holding the lining-up container 11 together with the pallet holder 14 and manipulating the former, a holder exchanging table 16 capable of detachably mounting the pallet holder 14, and an storing tank 17 for storing ethanol C as a liquid carrier in which a number of small solder balls having a diameter of approximately 0.1 mm are dispersed (hereinafter merely referred to as a carrier).

Figure 3:
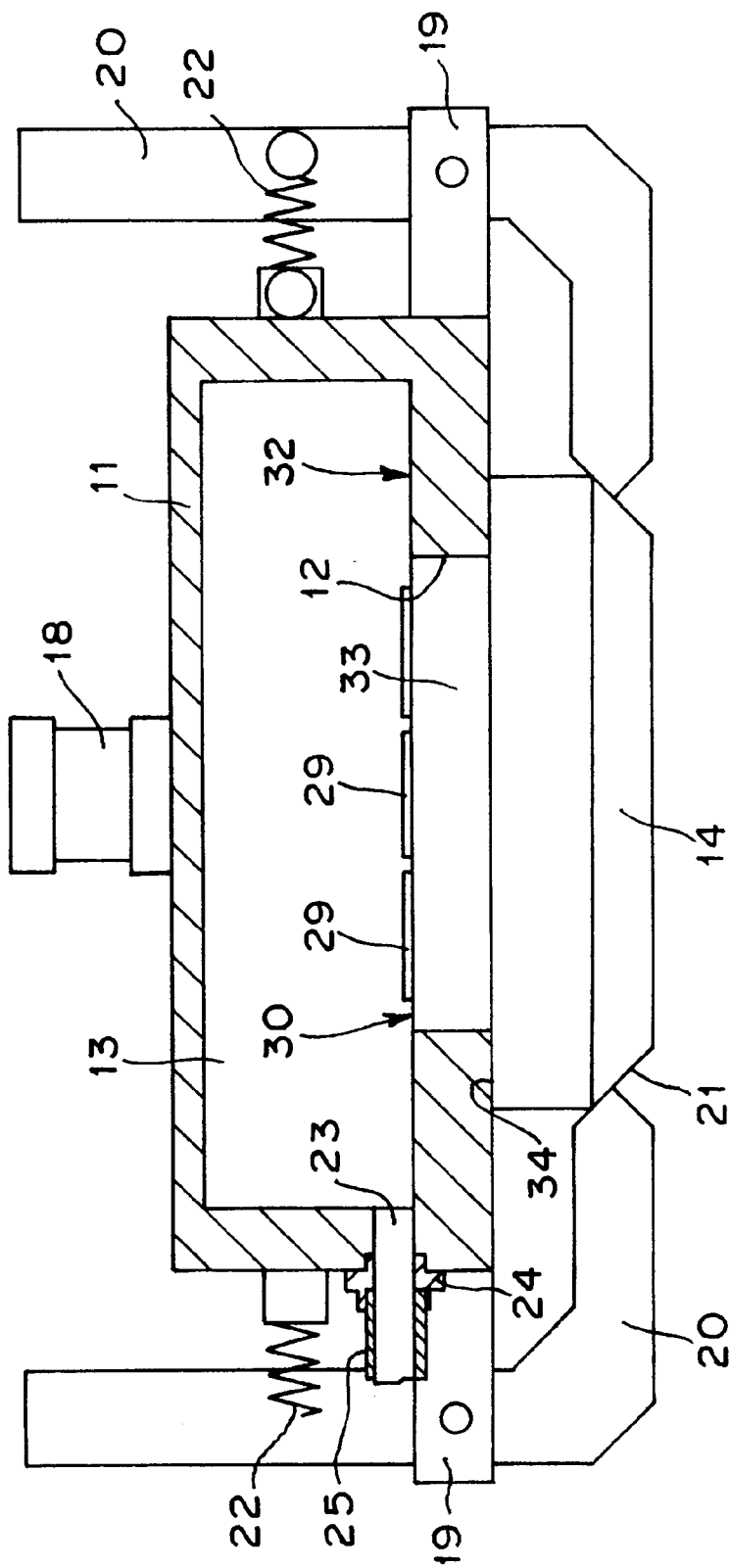
FIG. 3 is an enlarged sectional view of part of a lining-up container in the embodiment shown in FIG. 1.

FIG. 3 illustrates a schematic construction of the ball lining-up container 11 to which the pallet holder 14 is fitted. The ball lining-up container 11 having an opening 12 according to this embodiment has a connector 18 extending from the upper end thereof for mounting the container 11 in integral with the manipulator 15. A pair of brackets 19 protrude from the outer periphery of the ball lining-up container 11 at positions apart 180 degree from each other, and a pair of lock arms 20 are pivoted at middle portions thereof to the brackets 19, respectively, for preventing the pallet holder 14 fitted into the opening 12 from coming off therefrom. A tip end of each the lock arms 20 abuts to a conical surface 21 formed on the outer periphery of the lower end of the pallet holder 14 to generate a retaining force for urging the pallet holder 14 onto the ball lining-up container 11. A tensile spring 22 is interposed between the upper portion of the respective lock arm 20 and the ball lining-up container 11 for biasing the tip end of the lock arm 20 away from the conical surface 21 of the pallet holder 14. A communication hole 23 is provided in the ball lining-up container 11, which opens into the lower end of the sealed chamber 13 defined by the ball lining-up container 11 and the pallet holder 14. One end of a flexible duct 25 is connected to the communication hole 23 via a joint 24.

The manipulator 15 in this embodiment is a multi-joint robot functioned as pumping means according to the present invention in association with the duct 25. A chuck 26 is provided at a tip end of the manipulator 15, for gripping the connector 18 of the ball lining up container 11. A pair of locking cylinders 27, 27 are projected in the directions opposite to each other at a tip end of the manipulator 15 at positions apart 180 degrees from each other and abut to proximal ends of the lock arms 20, respectively. By extending piston rods 28 of the locking cylinders 27 toward the lock arms 20, respectively, the tip ends of the lock arms 20 abut to the conical surfaces 21 formed on the outer periphery of the lower end of the pallet holder 14 to urge the pallet holder 14 onto the ball lining-up container 11 and fixedly secured in integral therewith.

Figure 4:
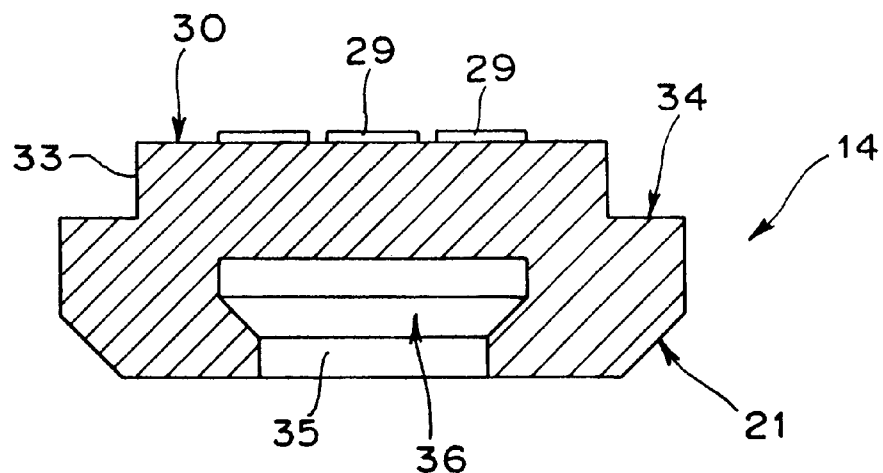
FIG. 4 is a sectional view of a pallet holder used in the embodiment shown in FIG. 1.
Figure 5:
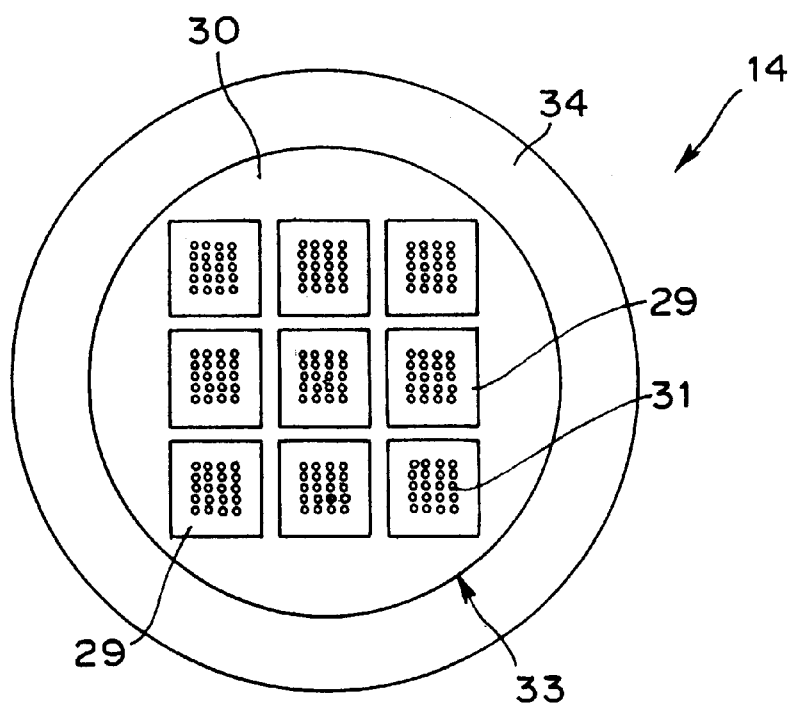
FIG. 5 is a plan view of the pallet holder shown in FIG. 4.
Figure 6:
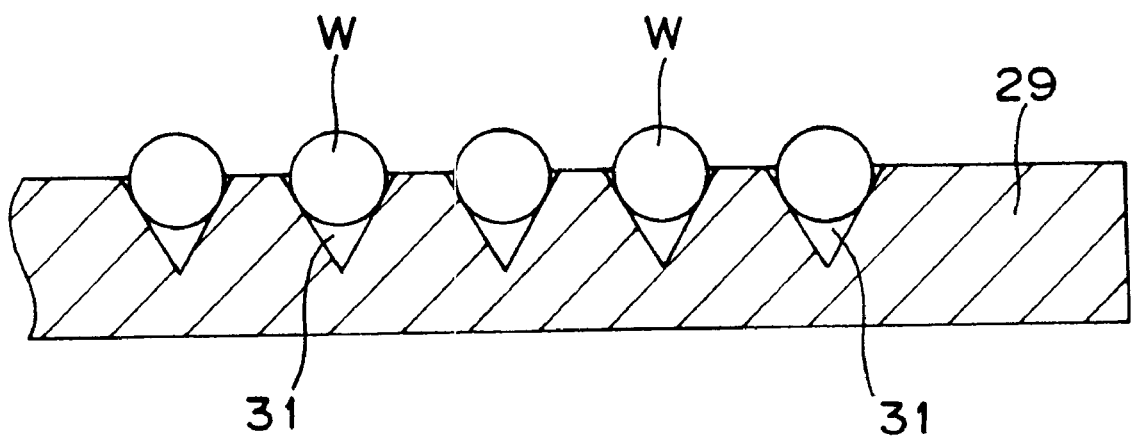
FIG. 6 is a sectional view illustrating a schematic construction of part of a ball carrying pallet to be mounted to the pallet holder shown in FIG. 4.

FIGS. 4 and 5 illustrate a sectional structure and a planar shape of the pallet holder 14 according to this embodiment, respectively, and FIG. 6 schematically illustrates a sectional structure of a ball carrying pallet 29 to be placed on the pallet holder 14. On a smooth upper end surface 30 formed in the pallet holder 14, a plurality of (nine in the illustrated embodiment) ball carrying pallets 29 are placed, each having conical pits 31 for accommodating solder balls W therein arranged at the lining-up state. The pit 31 formed in the ball carrying pallet 29 has a dimension so that the solder ball W is inserted therein by a somewhat deeper than a half thereof from the surface of the ball carrying pallet 29. The pits 31 are accurately formed at a predetermined pattern if the ball-carrying pallet 29 is made of a silicon wafer and the pits 31 are formed by the anisotropic etching technology used for producing the semiconductor.

The upper surface 30 of the pallet holder 14 is adapted to be flush with a bottom surface 32 of the ball lining-up container 11 when correctly fitted to the ball lining-up container 11. An engagement surface 33 of the pallet holder 14 opposite to the opening 12 of the ball lining-up container 12 is machined so that a gap between the same and the inner wall of the opening 12 of the ball lining-up container 12 is as small as possible to prevent the solder ball W from entering the gap. For the purpose of assuredly preventing the carrier C supplied into the sealed chamber 13 from leaking outside through the gap, a seal ring such as an O-ring may preferably be incorporated onto a stepped surface 34 of the ball lining-up container 11 in contact with the lower end surface.

A conical surface 36 is formed in a recess 35 provided in a central zone of the lower portion of the pallet holder 14, for fixedly securing the pallet holder 14 to the holder exchanging table 16.

Figure 7:
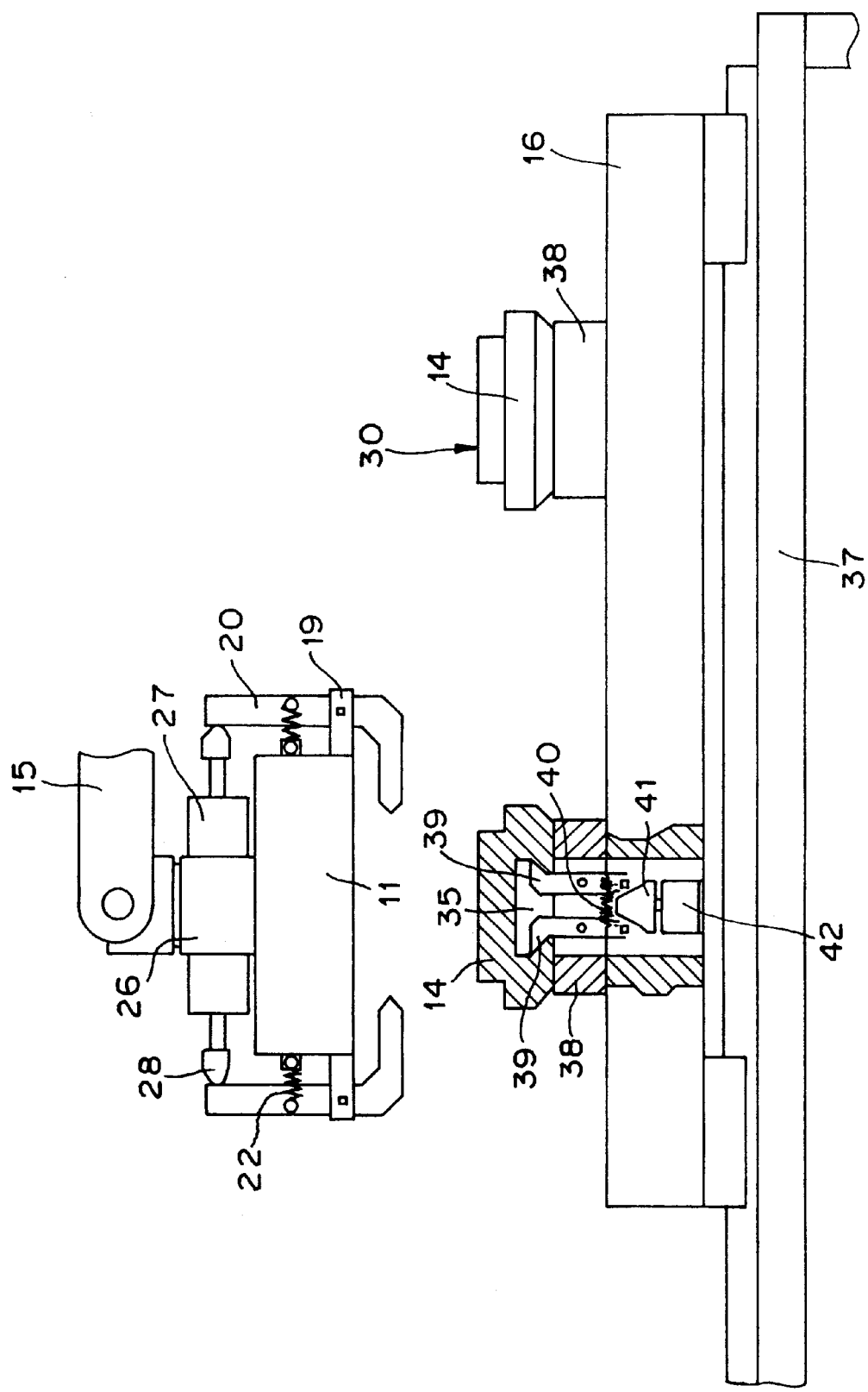
FIG. 7 is a sectional view illustrating a schematic construction of part of a holder table in the embodiment shown in FIG. 1.

FIG. 7 illustrates a partially broken view of the holder-exchanging table 16. The holder-exchanging table according to this embodiment is movable in reciprocation left ward and rightward on a bed 37 as viewed in FIG. 7. A pair of holder receivers 38 is attached onto the holder-exchanging table 16 along the moving direction thereof. A pair of clamp arms 39 engageable with the recess 35 of the pallet holder 14 is pivoted to the respective holder receiver 38 on which the pallet holder 14 is placed, at positions apart 180 degrees from each other. The pair of clamp arms 39 are connected to each other by a tensile spring 40 so that tip ends of the clamp arms are pressed onto the engagement surface 36. A clamp-releasing cylinder 42 is incorporated in the interior of the holder exchanging table 16, for releasing the pallet holder 14 from being fixed to the holder receiver 38 by pushing the proximal ends of the pair of clamp arms 39 away from each other against the elastic force of the tensile spring 40 to separate the tip ends of the clamp arms 39 from the engagement surface 36.

In FIG. 1, while the lining-up operation for the solder balls W is being carried out on the ball carrying pallets 29 placed on the pallet holder 14 mounted to one holder receiver 38 located left-hand in FIG. 1, the solder balls W already lined up on the ball carrying pallets 29 placed on the other holder receiver 38 located right-hand in FIG. 1 are sucked by using a suction head of a transferring device not shown and transferred to a bump-forming portion in an objective such as a semiconductor chip or a circuit board. These operations are alternately carried out on the left and right holder receivers 38. To carry out the attachment/detachment operation of the pallet holder 14 relative to the holder receiver 38 and the transferring operation by the transferring device always at the predetermined positions, the holder exchanging table 16 moves to locate the holder receiver 38 holding the desired pallet holder 14 therein at the desired position.

Figure 8:
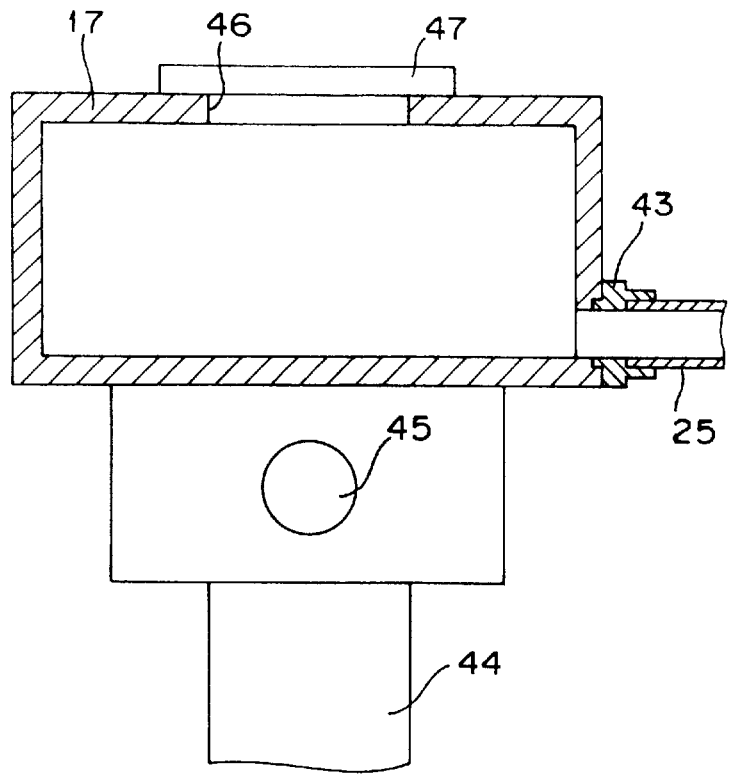
FIG. 8 is an enlarged sectional view of a storing tank in the embodiment shown in FIG. 1.

FIG. 8 illustrates a main part of the storing tank 17 in the enlarged manner. The storing tank 17 is connected via a joint 43 by a flexible duct 25 to the ball lining-up device 11, and held at the upper end of a stand 44 to be swingable about a pin 45. An opening 46 is provided in a central region of a top wall of the storing tank 17, for replenishing the solder balls W and the carrier C if necessary. The interior of the storing tank 17 is sealed by a lid member 47 detachably mounted to the opening 46. The storing tank 17 is disposed at a lower level than the pallet holder 14 placed on the holder receiver 38 as seen in the vertical direction.

Figure 9:
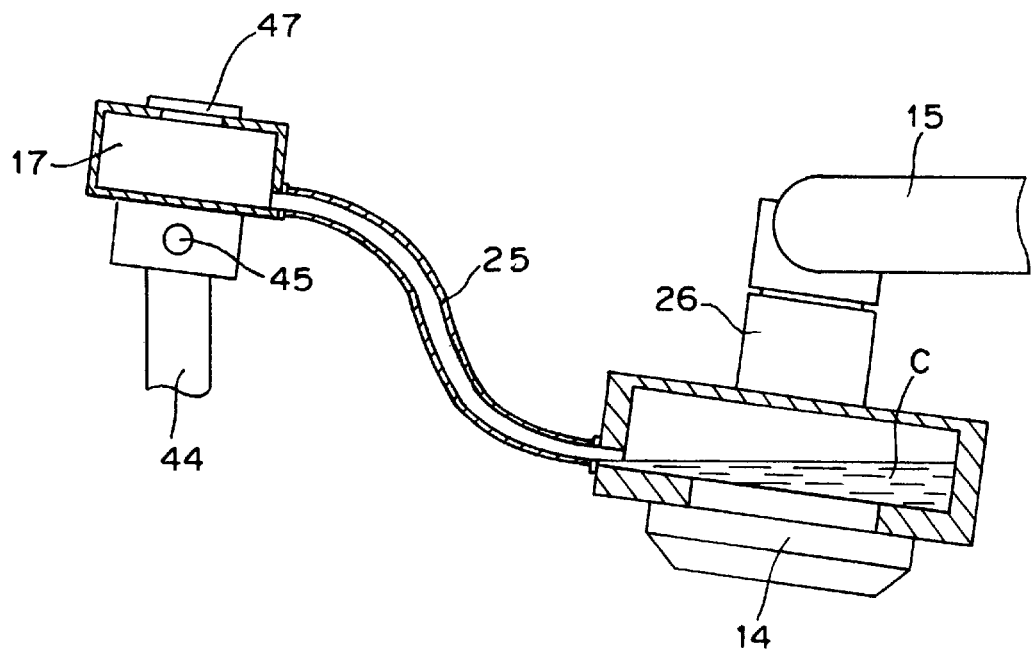
FIG. 9 is a schematic view of the operation for feeding micro-balls together with liquid carrier from the storing tank to the lining-up container.

Accordingly, there is neither solder balls W nor carrier C immediately after the sealed chamber 13 has been formed by fitting the fresh pallet holder 14 placed on the holder receiver 38 to the ball lining-up container 11. Thus, the pallet holder 14 is lifted up from the holder receiver 38 and laterally shifted to a position not interfering with the holder exchanging table 16, after which the manipulator 15 operates to bring the sealed chamber 13 to a lower level than the storing tank 17 as shown in FIG. 9 as seen in the vertical direction. Thereby, the solder balls W contained in the storing tank 17 flow into the sealed chamber 13 together with the carrier C through the duct 25. In this case, care must be taken to operate the manipulator 15 to incline the ball lining-up container 11 so that the joint 24 of the ball lining-up container 11 is directed upward while the joint 43 of the storing tank 17 is directed downward via the duct 25 to ensure all the solder balls W and the carrier C smoothly flowing.

After all the solder balls W and the carrier C has flowed into the sealed chamber 13, the manipulator 15 is operated to rock and rotate the ball lining-up container 11 so that the solder balls W are uniformly dispersed throughout the carrier C, whereby the lining-up operation is carried out wherein the solder balls W fall into the pits 31 of the ball carrying pallet 29. According to this embodiment, since the manipulator 15 is adopted, it is possible to easily realize the motion of the ball lining-up container 11 suitable for smoothly lining up the solder balls W in alignment with all the pits 31. Also, since the solder balls W are mixed with the carrier C, the adverse effect of static electricity and/or moisture is avoidable to achieve the stable lining-up operation.

Figure 10:
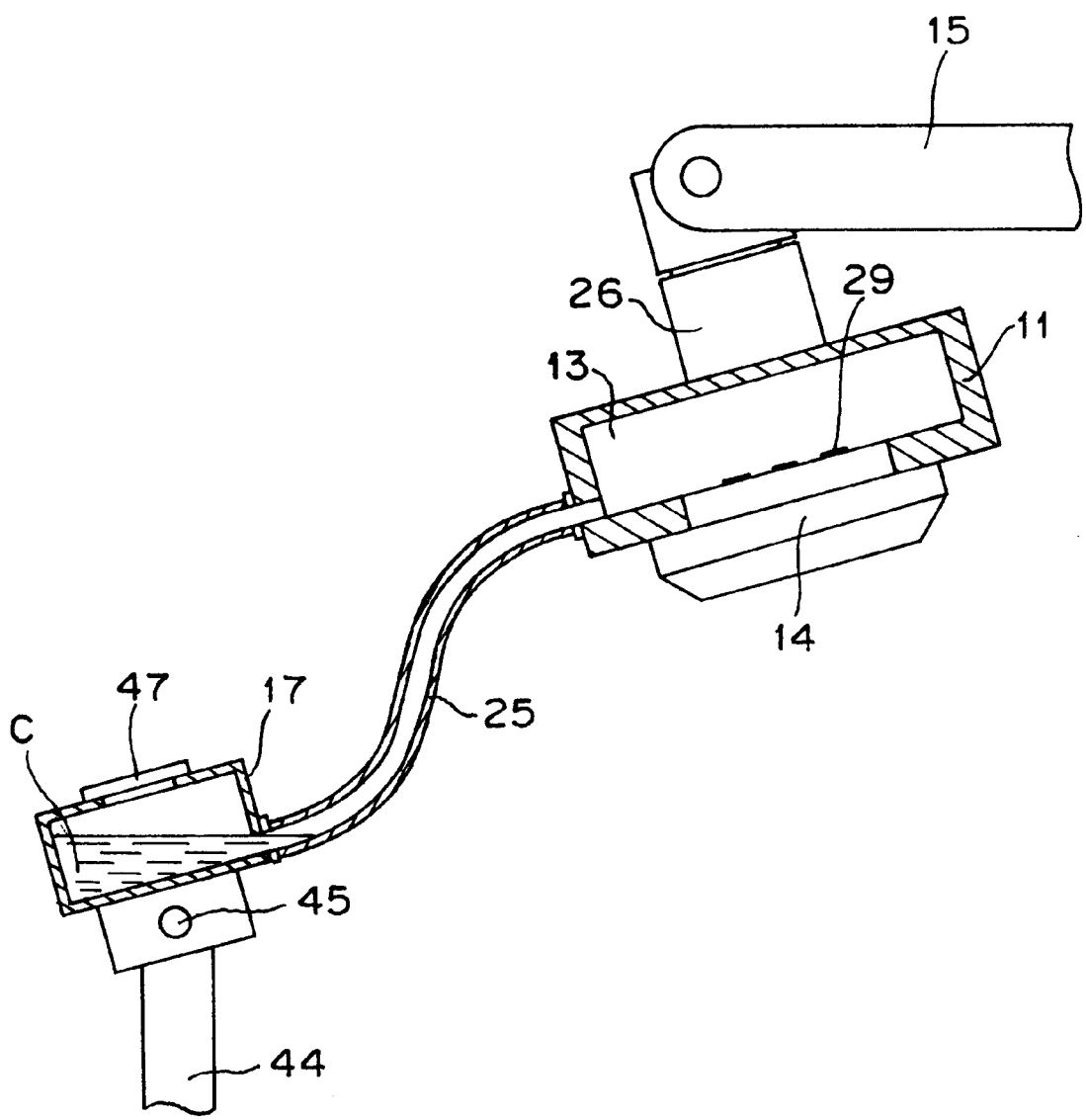
FIG. 10 is a schematic view of the operation for returning the micro-balls together with the liquid carrier from the lining-up container to the storing tank.

After the lining-up operation has been completed in such a manner, the surplus solder balls W are returned together with the carrier C to the storing tank 17. For this purpose, the ball lining-up container 11 is raised higher in the vertical direction than the storing tank 17 as shown in FIG. 10, and inclined so that the joint 24 of the ball lining-up container 11 is directed downward, while inclining the storing tank 17 about the pin 45 to direct the joint 43 of the storing tank 17 upward by using the elastic deformation of the duct 25, whereby the surplus solder balls W in the sealed chamber 13 are returned together with the carrier C to the storing tank 17. In this regard, care must be taken so that no solder balls W held in the pits 31 come off therefrom.

Figure 11:
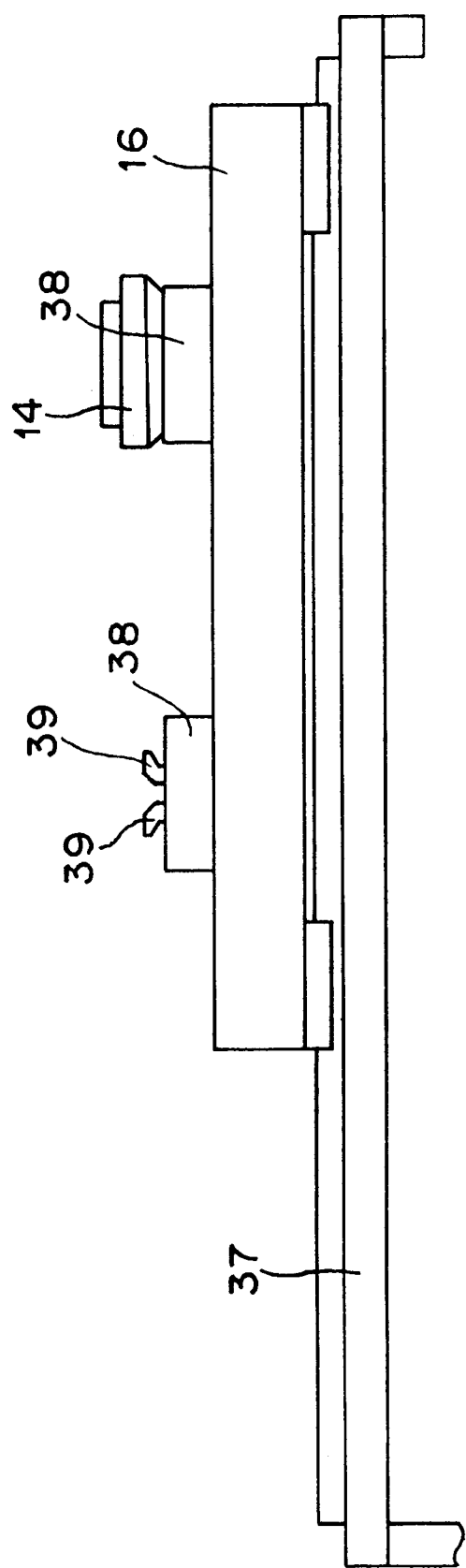
FIG. 11 is a conceptual view of the operation of one step of exchanging the pallet holder; the remaining steps being illustrated in FIGS. 12 to 14.
Figure 12:
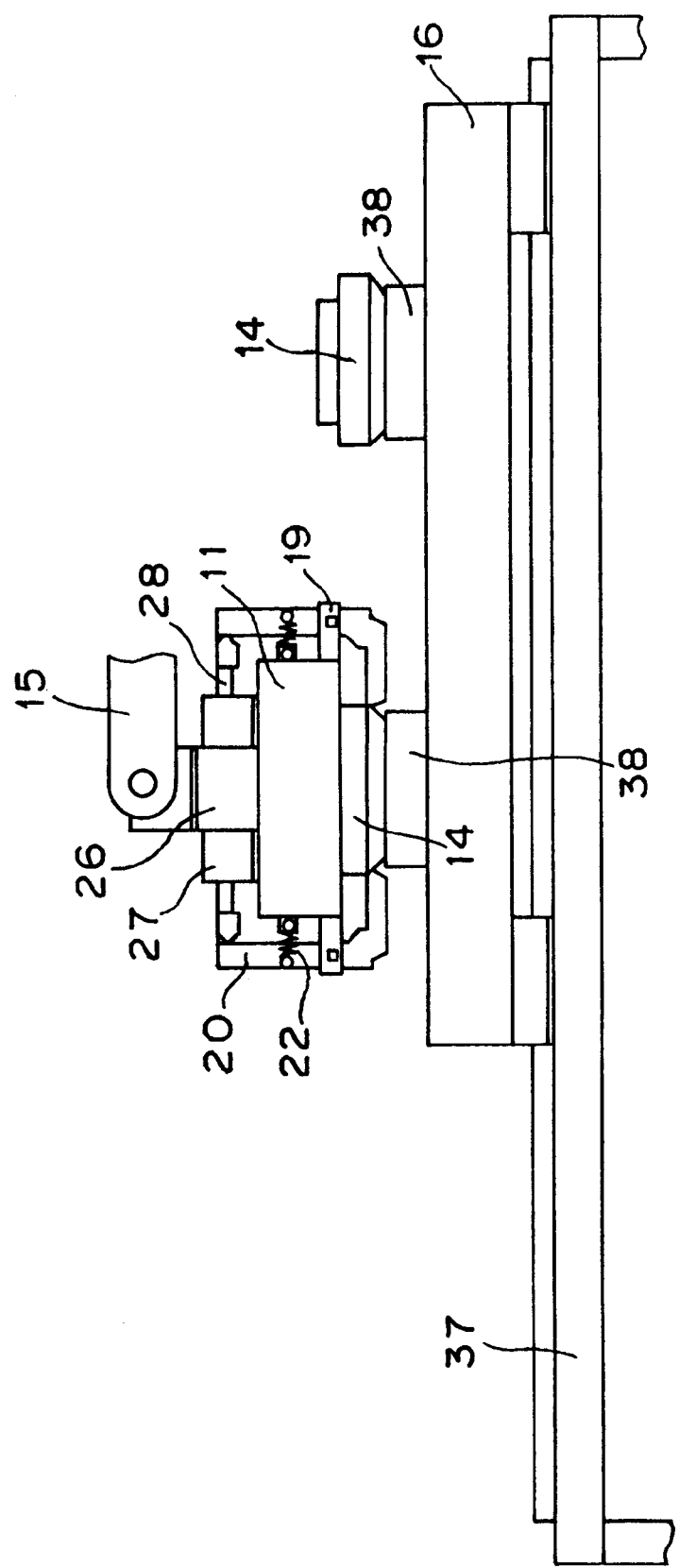
FIG. 12 is a conceptual view of the operation of another step of exchanging the pallet holder; the remaining steps being illustrated in FIGS. 11, 13 and 14.
Figure 13:
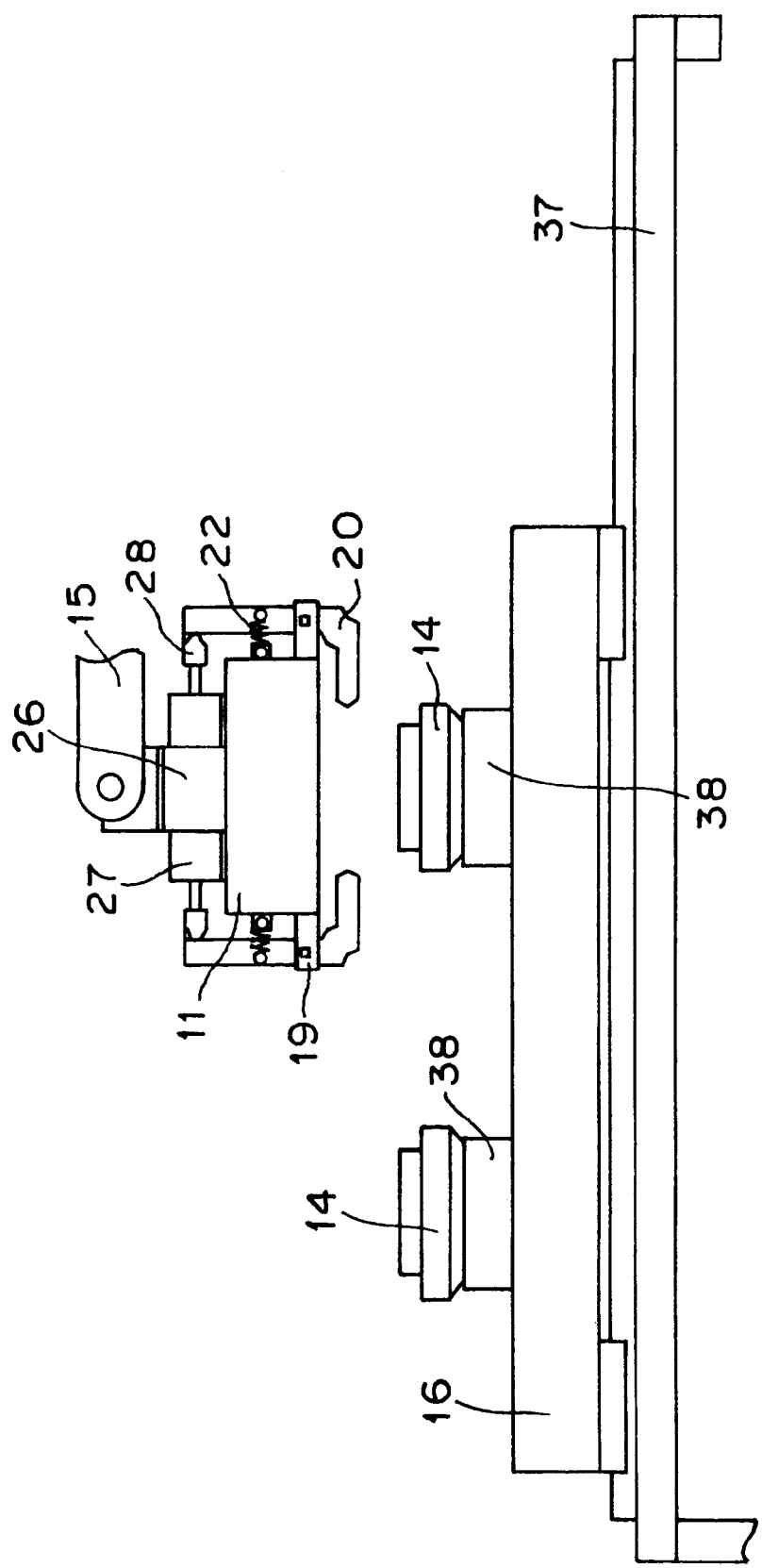
FIG. 13 is a conceptual view of the operation of a further step of exchanging the pallet holder; the remaining steps being illustrated in FIGS. 11, 12 and 14.
Figure 14:
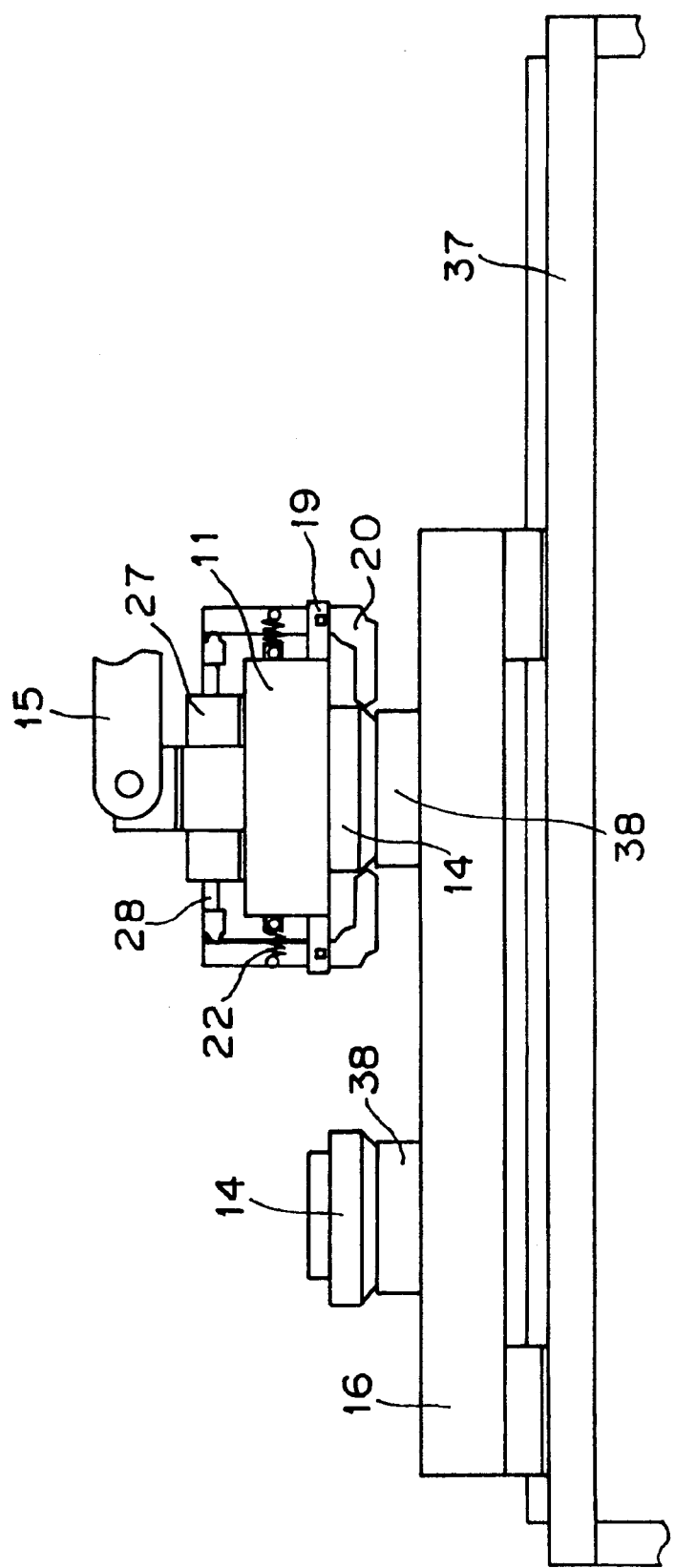
FIG. 14 is a conceptual view of the operation of a still further step of exchanging the pallet holder; the remaining steps being illustrated in FIGS. 11 to 13.

Thereafter, as shown in FIG. 12, the pallet holder 14 is returned to the waiting vacant holder receiver 38 shown in FIG. 11, and the operation of the clamp-releasing cylinder 42 is interrupted to engage the tip ends of the clamp arms 39 with the engagement surface 36 of the pallet holder 14 due to the elastic force of the tensile spring 40, whereby the pallet holder 14 is secured to the holder receiver 38. Then, the operation of the pair of locking cylinders 27 is interrupted to retreat the tip ends of the lock arms 20 from the conical surface 21 of the pallet holder 14 due to the elastic force of the tensile springs 22, whereby the ball lining-up container 11 is released from the pallet holder 14. Next, the manipulator 15 is operated to move the ball lining-up container 11 upward and disengage and separate the pallet holder 14 from the ball lining-up container 11. Thereafter, as illustrated in FIG. 13, the holder exchanging table 16 is operated to move the fresh pallet holder 14 held by the other holder receiver 38 adjacent to the former to a position directly beneath the ball lining-up container 11. Then, as shown in FIG. 14, the manipulator 15 is operated to lower the ball lining-up container 11 again and engage the same with the pallet holder 14 held by the other holder receiver 38, after which the locking cylinders 27 are operated to fixedly secure the pallet holder 14 to the ball lining-up container 11. Further, the clamp-releasing cylinder 42 is operated to disengage the pallet holder 14 from the holder receiver 38, after which the pallet holder 14 is lifted up from the holder receiver 38. Next, the manipulator 15 is operated to laterally shift this pallet holder 14 to a position at which the pallet holder 14 does not interfere with the holder exchanging table 16 and the sealed chamber 13 is located lower than the storing tank 17 as shown in FIG. 9. The above-mentioned steps are repeated to line up the solder balls W to the fresh pallet holder 14.

In the meanwhile, the solder balls W are sucked from the ball carrying pallets 29 on the pallet holder 14 held by the one holder receiver 39 by using the transferring device not shown, and transferred to the objective such as a semiconductor chip or a circuit board. The pallet holder 14 attractively holding the solder balls W is in a waiting state for the next lining-up operation. In such a manner, the lining-up operation for the solder balls W is alternately carried out on the pallet holders 14 held by the two holder receivers 38. In this regard, when the solder balls W has expired or the carrier C has evaporated in association with the above operation, the lid member 47 may be removed from the storing tank 17 to replenish the solder balls W or the carrier C if necessary.

According to this embodiment, since the highly volatile carrier C is stored in the sealed storing tank 17 and movable between the same and the sealed chamber 13 defined by the ball lining-up container 11 and the pallet holder 14 through the duct 25, it is possible to restrict the reduction of the carrier C due to the vaporization as small as possible.

While the solder balls W and the carrier C are transferred between the ball lining-up container 11 and the storing tank 17 by shifting the relative positions thereof in the vertical direction by using the manipulator 15 in the above embodiment, the solder balls W and the carrier C may be forcibly transferred by using a pump or the like. Also, while the storing tank 17 is inclined about the pin 45 by using the elastic deformation of the flexible duct 25 in the above embodiment, the inclination may be switched by using a positive power.

The present invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A method for lining up micro-balls in a plurality of pits, respectively, formed on surfaces of ball carrying pallets, comprising the steps of:

defining a first sealed chamber by attaching the ball carrying pallets to a lining-up container so that the surfaces of the ball carrying pallets abut on the chamber, supplying the micro-balls dispersedly mixed with liquid carrier stored in a second sealed chamber to the first sealed chamber via a flexible duct so that the micro-balls are held in the pits of the ball carrying pallets, respectively, returning the surplus micro-balls together with the liquid carrier from the first sealed chamber to the second sealed chamber via the duct, and removing the ball carrying pallets from the lining-up container.

2. A method for lining up micro-balls as claimed in claim 1, further comprising the step of vibrating the ball carrying pallets while supplying the liquid carrier with which the micro-balls are dispersedly mixed to the first sealed chamber.

3. A method for lining up micro-balls as claimed in claim 1, wherein the transfer of the micro-balls and the liquid carrier between the first and second chambers is carried out by shifting the relative positions of both the sealed chambers in the vertical direction.

4. A method for lining up micro-balls as claimed in claim 1, wherein the liquid carrier is electrically conductive.

5. A method for lining up micro-balls as claimed in claim 4, wherein the liquid carrier is alcohol.

6. A method for lining up micro-balls as claimed in claim 1, wherein the micro-balls are solder balls.

7. An apparatus for lining up micro-balls, comprising ball carrying pallets, each having a plurality of pits for holding the micro-balls, respectively, on its surface, a pallet holder for holding the ball carrying pallets, a lining-up container defining a sealed chamber in association with the pallet holder hermetically fitted thereto, a storing tank for storing liquid carrier in which micro-balls are dispersed, and applying/collecting means for communicating the storing tank with the lining-up container via a passage to supply the micro-balls together with the liquid carrier from the storing tank to the sealed chamber and return the surplus micro-balls together with the liquid carrier from the sealed chamber to the storing tank.

8. An apparatus for lining up micro-balls as claimed in claim 7, wherein further comprising vibration means for vibrating the pallet holder while the latter is fitted to the lining-up container.

9. An apparatus for lining up micro-balls as claimed in claim 7, wherein the applying/collecting means transports the liquid carrier by changing a position of the storing tank in the vertical direction relative to the lining-up container fitted with the pallet holder.

10. An apparatus for lining up micro-balls as claimed in claim 7, wherein the applying/collecting means operates to incline, relative to the horizontal plane, the surfaces of the ball carrying pallets held by the pallet holder fitted with the lining-up container.

11. An apparatus for lining up micro-balls as claimed in claim 7, wherein the micro-balls are solder balls.

* * * * *

UNITED STATES PATENT AND TRADEMARK OFFICE
CERTIFICATE OF CORRECTION

PATENT NO. : 6,422,452 B2
DATED : July 23, 2002
INVENTOR(S) : Takumi Yamamoto et al.

It is certified that error appears in the above-identified patent and that said Letters Patent is hereby corrected as shown below:

Title page,
Assignee, after "(JP)" insert --; NEC Corporation; Tokyo (JP) --

Column 1,
Line 41, change "nether" to -- neither --

Column 2,
Line 51, change "an" to -- a --

Column 4,
Line 35, change "an" to -- a --

Column 5,
Line 47, change "left ward" to -- leftward --

Signed and Sealed this

Eleventh Day of February, 2003

JAMES E. ROGAN
*Director of the United States Patent and Trademark Office*